United States Patent
Chen et al.

(10) Patent No.: US 11,144,198 B2
(45) Date of Patent: Oct. 12, 2021

(54) CONTROL METHOD OF TOUCH DISPLAY APPARATUS

(71) Applicant: MPI Corporation, Hsinchu County (TW)

(72) Inventors: Chien-Hung Chen, Hsinchu County (TW); Guan-Jhih Liou, Hsinchu County (TW); Lin-Lin Chih, Hsinchu County (TW); Stojan Kanev, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 155 days.

(21) Appl. No.: 16/364,747

(22) Filed: Mar. 26, 2019

(65) Prior Publication Data

US 2019/0361603 A1    Nov. 28, 2019

Related U.S. Application Data

(60) Provisional application No. 62/676,308, filed on May 25, 2018.

(51) Int. Cl.
| | |
|---|---|
| *G06F 3/0488* | (2013.01) |
| *G06F 3/0484* | (2013.01) |
| *G01R 31/317* | (2006.01) |
| *G01R 31/319* | (2006.01) |
| *G09G 3/00* | (2006.01) |

(52) U.S. Cl.
CPC ... *G06F 3/04886* (2013.01); *G01R 31/31728* (2013.01); *G01R 31/31912* (2013.01); *G06F 3/0488* (2013.01); *G06F 3/04845* (2013.01); *G09G 3/006* (2013.01); *G06F 2203/04803* (2013.01); *G06F 2203/04808* (2013.01)

(58) Field of Classification Search
CPC ....... G06F 3/04886; G06F 2203/04808; G06F 2203/04803; G06F 3/04845
See application file for complete search history.

(56) References Cited

U.S. PATENT DOCUMENTS

| | | | |
|---|---|---|---|
| 2005/0134578 A1* | 6/2005 | Chambers | G06F 3/0486 345/184 |
| 2006/0132460 A1* | 6/2006 | Kolmykov-Zotov | G06F 3/04812 345/173 |

(Continued)

FOREIGN PATENT DOCUMENTS

| | | |
|---|---|---|
| CN | 104582911 A | 4/2015 |
| TW | 201627681 A | 8/2016 |
| TW | 201627851 A | 8/2016 |

*Primary Examiner* — Anil K Bhargava
(74) *Attorney, Agent, or Firm* — Birch, Stewart, Kolasch & Birch, LLP

(57) ABSTRACT

A control method of a touch display apparatus applicable to a probe station is provided. The probe station includes a movable element. The movable element is a chuck stage, a camera stage, a probe platen, or a positioner. The control method of a touch display apparatus includes displaying a first window and a second window on a touch display apparatus; displaying an operation interface on the first window and displaying a real-time image on the second window; and detecting a touch instruction generated on the operation interface, where the movable element moves according to the touch instruction.

13 Claims, 4 Drawing Sheets

(56) References Cited

U.S. PATENT DOCUMENTS

| | | | | |
|---|---|---|---|---|
| 2008/0165255 A1* | 7/2008 | Christie | ............ | G06F 3/04883 |
| | | | | 348/207.99 |
| 2010/0083167 A1* | 4/2010 | Kikuchi | ................ | G06F 3/0488 |
| | | | | 715/786 |
| 2011/0163972 A1* | 7/2011 | Anzures | ............. | G06F 3/04883 |
| | | | | 345/173 |
| 2011/0285636 A1* | 11/2011 | Howard | ............. | A63F 13/2145 |
| | | | | 345/173 |
| 2019/0033996 A1* | 1/2019 | Marriott | ................ | G06F 3/0416 |

\* cited by examiner

CONTROL METHOD OF TOUCH DISPLAY APPARATUS

CROSS-REFERENCE TO RELATED APPLICATION

This non-provisional application claims priority under 35 U.S.C. § 119(e) to U.S. Provisional Patent Application No. 62/676,308, filed on May 25, 2018, the entire contents of which are hereby incorporated by reference.

BACKGROUND

Technical Field

The present invention relates to a control method of a touch display apparatus, and in particular, to a movable element control method of a touch display apparatus of a probe station.

Related Art

A common probe station controls a movable element, such as a chuck stage, a camera stage, or a positioner stage, in a machine station by using a physical button or joystick disposed on the machine station, and the movable element is displaced based on control of the physical button or joystick on the machine station. When operating the physical button or joystick, a user can determine a control result only based on operation experience and hand feeling. This cannot meet diversified control demands.

SUMMARY

The present invention provides a control method of a touch display apparatus, applicable to a probe station including a movable element, where the movable element is selected from one of a chuck stage, a camera stage, and a positioner. The control method of a touch display apparatus includes: displaying a first window and a second window on a touch display apparatus; displaying an operation interface on the first window, and displaying a real-time image on the second window; and detecting a touch instruction generated on the operation interface, where the movable element moves according to the touch instruction.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
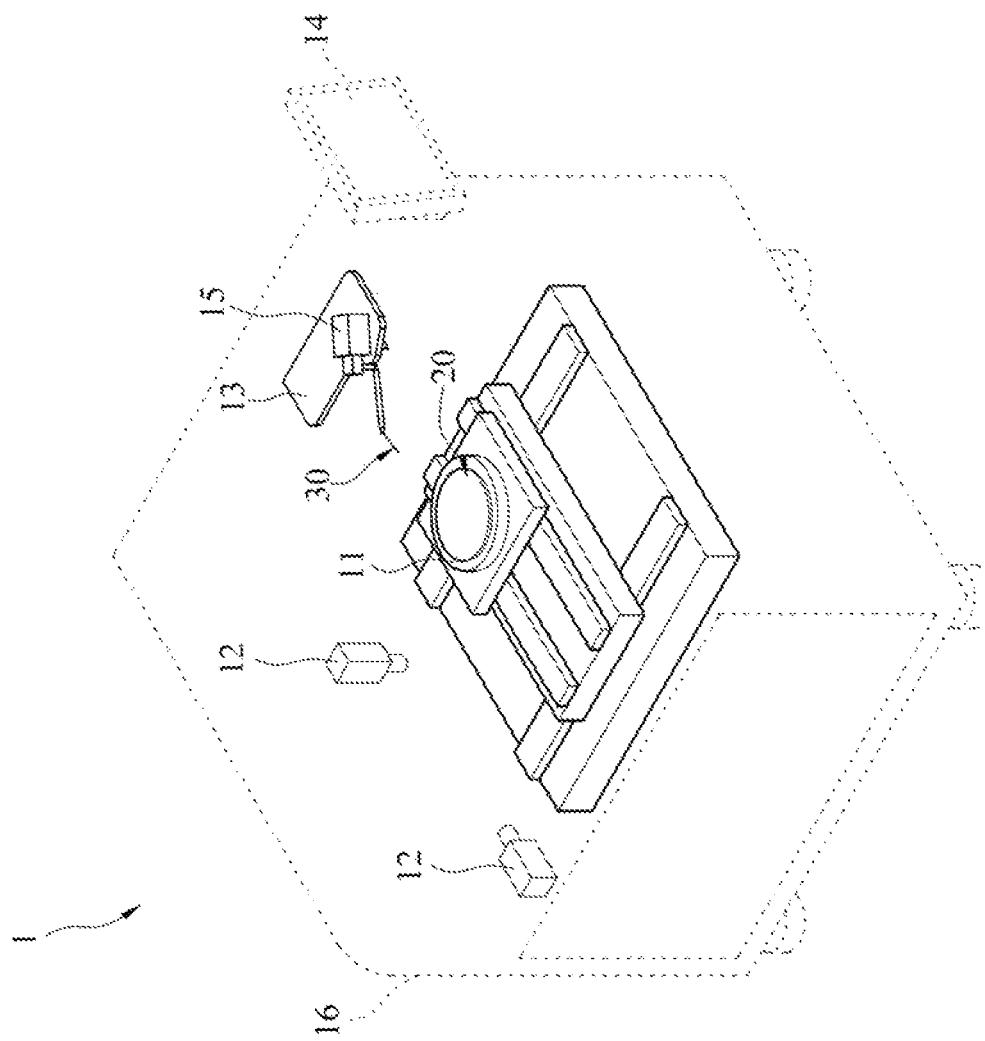
FIG. 1 shows a probe station to which an embodiment of a control method of a touch display apparatus is applicable according to the present invention.

Referring to FIG. 1, FIG. 1 shows a probe station to which an embodiment of a control method of a touch display apparatus is applicable according to the present invention. The probe station 1 shown in FIG. 1 includes a chuck stage 11, a camera stage 12, a probe platen 13, a touch display apparatus 14, a positioner 15, and a casing 16. The chuck stage 11, the camera stage 12, and the positioner 15 are movable elements. The touch display apparatus 14 may be configured to display a digital wafer map, a wafer calibration substrate image, and an image captured by the camera stage 12 in real time. The positioner 15 is disposed on the probe platen 13. The positioner 15 can move relative to the probe platen 13. The camera stage 12 may capture an image above the chuck stage 11 along a Z axis direction, or may capture an image along a side of the casing 16 along an X axis direction or a Y axis direction. In addition, the movable elements are not limited to the chuck stage 11, the camera stage 12, and the positioner 15.

Still referring to FIG. 1, a wafer 20 is mounted on the chuck stage 11 of the probe station 1, and a probe 30 is fixed on the positioner 15. Herein, the probe 30 may be disposed on the positioner 15 and then be disposed on the probe platen 13 or may be disposed on a probe card and then be disposed on the probe platen 13. The present invention is not limited thereto. The probe platen 13 of the probe station 1 may be displaced to approach the chuck stage 11, the probe 30 on the probe platen 13 is in contact with the wafer 20, and a tip of the probe 30 is in contact with the wafer 20 and pierces an oxide layer to form an electrical connection to perform detection.

Figure 2:
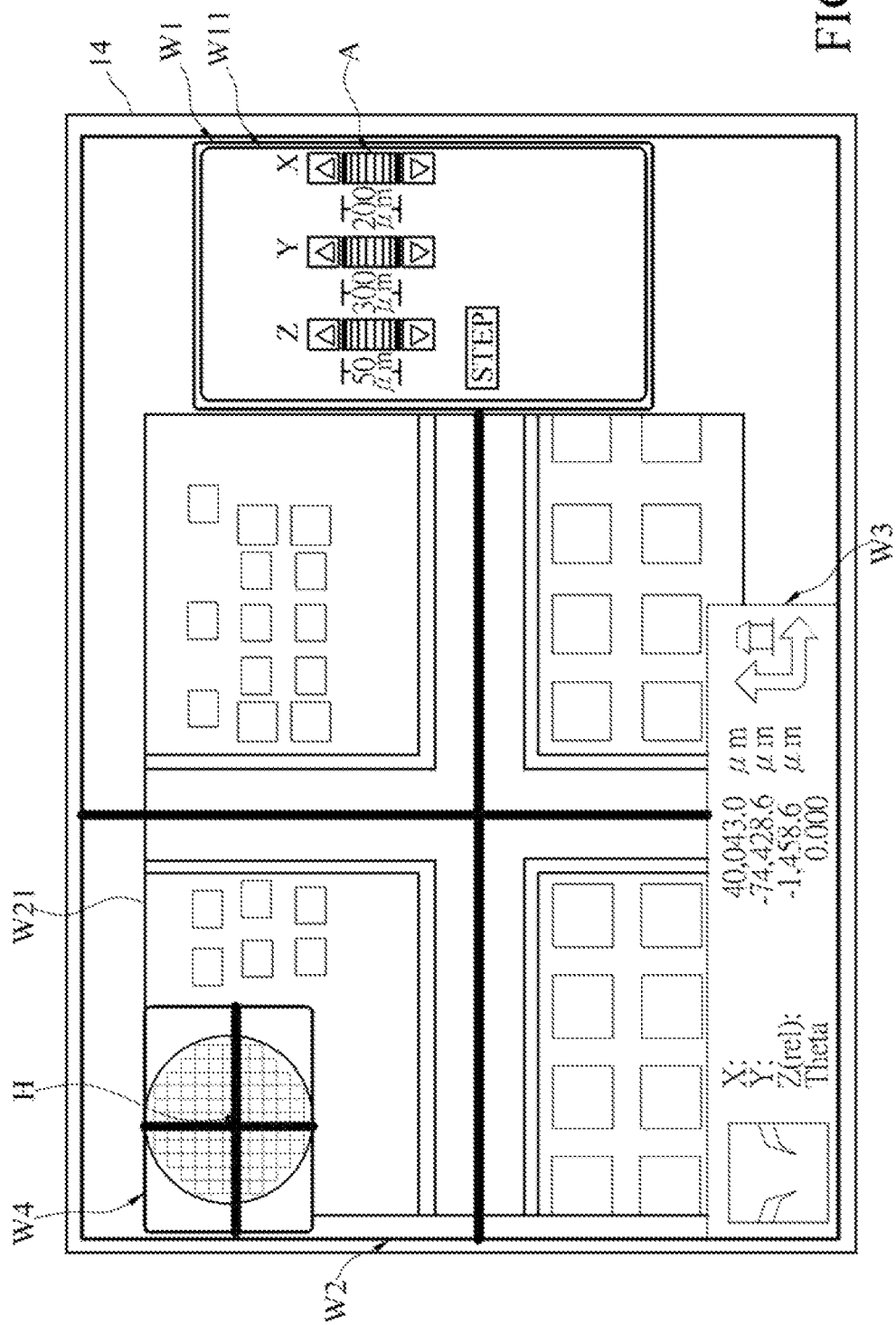
FIG. 2 is a schematic diagram of an embodiment that a touch display apparatus of a probe station to which a control method of a touch display apparatus is applicable displays an operation interface according to the present invention.

Referring to FIG. 1 and FIG. 2, herein, the touch display apparatus 14 of the probe station 1 may be configured to display an operation interface W11 for controlling the movable element, and a user controls the movable element by using the touch display apparatus 14. Further, in an embodiment, information about control is displayed by using the touch display apparatus 14 so that a detection operator can more quickly and accurately determine a control status of the movable element. One step of the control method of a touch display apparatus in the present invention is displaying a first window W1 and a second window W2 on the touch display apparatus 14. In an embodiment, the first window W1 and the second window W2 are simultaneously displayed on the touch display apparatus 14. Therefore, the first window W1 and the second window W2 may be displayed on the touch display apparatus 14 in parallel or be displayed on the touch display apparatus 14 in an overlapping manner.

Further, another step of the control method of a touch display apparatus in the present invention is displaying the operation interface W11 on the first window W1 and displaying a real-time image W21 on the second window W2. The operation interface W11 on the first window W1 is a graphical interface configured to control displacement of the movable element, and the real-time image W21 on the second window W2 is an image that is captured by the camera stage 12 in real time and that is of the wafer 20 on the chuck stage 11.

Further, still another step of the control method of a touch display apparatus in the present invention is after displaying the operation interface W11 on the first window W1, detecting a touch instruction generated on the operation interface W11, where the movable element moves according to the touch instruction.

In an embodiment, a manner in which the movable element moves according to the touch instruction generated on the operation interface W11 on the first window W1 may include linear displacement, rotation, or a combination of linear displacement and rotation. Specifically, in an embodiment that the movable element performs linear displacement according to the touch instruction, the movable element may move along a single linear direction, move along two linear directions that are perpendicular to one another, or move along three linear directions that are perpendicular to each other.

Further, the touch instruction generated on the operation interface W11 may be performing an action of tap, rotation, sliding, or multi-touch at a position that is on the first window W1 of the touch display apparatus 14 and that corresponds to the operation interface W11. To be specific, when the operator performs an action of tap, sliding, or multi-touch at a position that is on the first window W1 of the touch display apparatus 14 and that corresponds to the operation interface W11, the operation interface W11 may detect the touch instruction. Certainly, in other embodiments, a touch action capable of generating a touch instruction may also be user-defined.

In some embodiments, the touch instruction that is generated on the first window W1 of the touch display apparatus 14 and corresponding to the operation interface W11 may be different according to different images on the operation interface W11. In an embodiment, referring to FIG. 2, the operation interface W11 includes an image of a visual scroll wheel A.

In this embodiment, a manner of generating a touch instruction on the image of the visual scroll wheel A may be an operation mode that simulates that of a physical scroll wheel. To be specific, the user may perform scrolling or sliding on the image of the visual scroll wheel A of the touch display apparatus 14 to achieve a same control effect that can be achieved by a physical scroll wheel. Specifically, the image of the visual scroll wheel A has a rectangular outline, and a touch instruction may be generated through sliding along a long side of the image of the visual scroll wheel A. The touch instruction generated on the image of each visual scroll wheel A may be used to control the movable element to be displaced along a single linear direction. Therefore, in other embodiments, referring to FIG. 2 and FIG. 3, when the movable element is to be controlled to be displaced along a plurality of linear directions, images of a plurality of visual scroll wheels A may be provided on the first window W1, and the touch instructions generated on the images of the visual scroll wheels A may be used to control the movable element to be displaced toward different linear directions.

Figure 3:
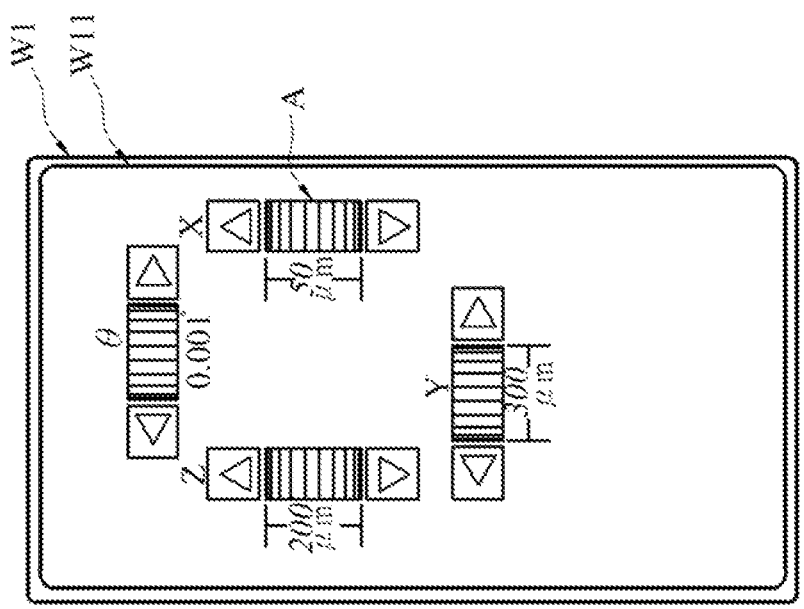
FIG. 3 is a schematic diagram of another embodiment of an operation interface to which a control method of a touch display apparatus is applicable according to the present invention.

Still referring to FIG. 2 and FIG. 3, further, in an embodiment in which the images of the plurality of visual scroll wheels A are provided on the first window W1, to make a detection operator intuitively learn of control directions of movable elements corresponding to the images of the visual scroll wheels A, in an embodiment, the control directions of the movable elements corresponding to the images of the visual scroll wheels A may be indicated directly by using, but is not limited to, letters. In this embodiment, the first window W1 may include a literal indication at a position adjacent to the image of the visual scroll wheel A, and the literal indication directly corresponds to a control direction of a movable element of an image of an adjacent visual scroll wheel A. In a specific embodiment, the literal indication may be, but is not limited to, an English letter such as X, Y, or Z to directly indicate the control direction of the movable element corresponding to the image of the visual scroll wheel A.

Still referring to FIG. 2 and FIG. 3, in another embodiment, the long side of the image of the visual scroll wheel A may be provided along the control direction of the corresponding movable element, so that the user can intuitively learn of the control directions of the movable elements corresponding to the images of the visual scroll wheels A through visual sense. Certainly, arranging the images of the visual scroll wheels A in parallel and distinguishing the control directions of the movable elements corresponding to the images of the visual scroll wheels A by using the literal indication is also a feasible implementation mode.

Still referring to FIG. 2 and FIG. 3, in an embodiment, to more clearly indicate a method for touching the image of the visual scroll wheel A to the detection operator, the first window W1 may further include a first touch indication and a second touch indication at two ends of the long side of the image of the visual scroll wheel A. The first touch indication and the second touch indication may be indicating, by using images, moving to two ends of a direction controlling displacement of the movable element. Specifically, the first touch indication and the second touch indication are images of arrows having opposite directions. Therefore, the detection operator performs sliding or scrolling on the image of the visual scroll wheel A according to an indication direction of the first touch indication or the second touch indication to generate the touch instruction on the image of the visual scroll wheel A.

Figure 4:
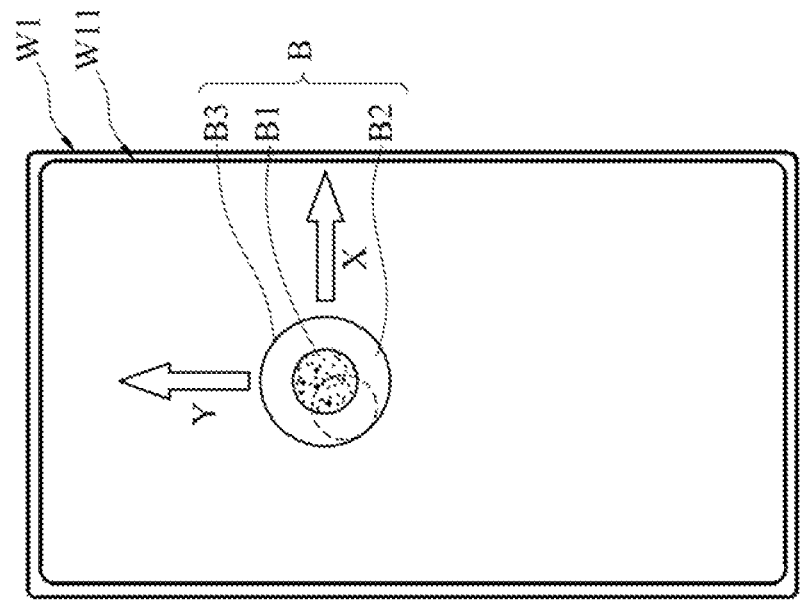
FIG. 4 is a schematic diagram of still another embodiment of an operation interface to which a control method of a touch display apparatus is applicable according to the present invention.

Referring to FIG. 4, in an embodiment, the operation interface W11 may include an image of a visual joystick B. In this embodiment, a manner of generating a touch instruction on the image of the visual joystick B may be an operation mode that simulates that of a physical joystick. To be specific, the user may perform dragging as well as keeping in contact with the image of the visual joystick B of the touch display apparatus 14 to achieve a same control effect that can be achieved by a physical joystick. Specifically, the image of the visual joystick B includes at least a touch joystick region B1, an instruction generation region B2, and an instruction boundary B3. The touch joystick region B1 is circular. The instruction boundary B3 and the outline of the touch joystick region B1 form a concentric circle, and the diameter of the instruction boundary B3 is larger than the diameter of the outline of the touch joystick region B1, and the range between the outline of the touch joystick region B1 and the instruction boundary B3 is the instruction generation region B2.

In this embodiment, the touch instruction may be generated when contact with the touch joystick region B1 in the image of the visual joystick B is kept and when the touch joystick region B1 is dragged to the instruction generation region B2. The user can touch and press the touch joystick region B1 and drags the touch joystick region B1 to rotate, to be displaced toward the instruction boundary B3, to generate the touch instruction in the instruction generation region B2. Specifically, the touch joystick region B1 is dragged to any position in the instruction generation region B2, and different coordinate values may be defined according to two-dimensional coordinates. Different touch instructions are generated on the operation interface W11 according to different coordinate values. In a specific implementation mode, when the touch instruction is generated according to a two-dimensional coordinate value, the image of the visual joystick B may be, but is not limited to, used to control the movable element to be displaced along an X direction and a Y direction that are perpendicular to one another.

Figure 5:
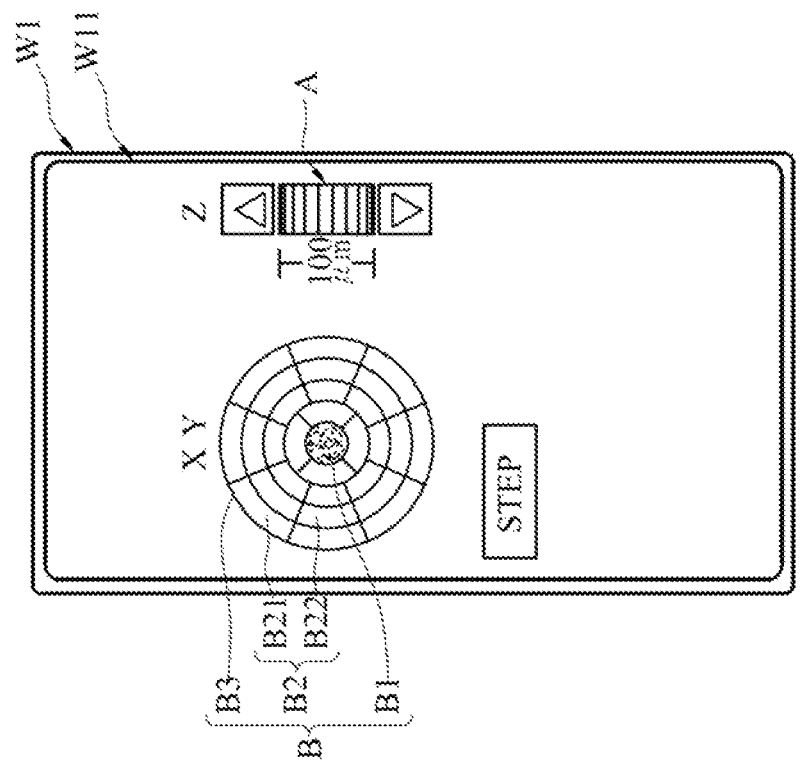
FIG. 5 is a schematic diagram of yet another embodiment of an operation interface to which a control method of a touch display apparatus is applicable according to the present invention.

Referring to FIG. 5, in an embodiment, the instruction generation region B2 in the image of the visual joystick B further includes a plurality of first segment control regions B21. The first segment control regions B21 are specifically ring-shaped regions whose distances from the circle center of the touch joystick region B1 are different. Specifically, the first segment control regions B21 are concentric rings having different diameters relative to the touch joystick region B1. The first segment control region B21 further includes a plurality of second segment control regions B22, and the second segment control regions B22 are specifically sector regions obtained by dividing the first segment control region B21 with equal circumference angles. Herein, different touch instructions may be generated in the first segment control region B21 and the second segment control region B22. In a specific implementation mode, the touch instructions generated in different first segment control regions B21 may be used to control the movable element to move at different moving speeds, and the touch instructions generated in different second segment control regions B22 may be used to control the movable element to be displaced toward different displacement directions.

Still referring to FIG. 5, further, in a specific embodiment, the first segment control region B21 may further be set according to a distance from the touch joystick region B1 to control the moving speed of the movable element. For example but not limited to, the first segment control region B21 closer to the touch joystick region B1 controls the moving speed of the movable element to be slower, and the moving speed of the movable element increases as the distance from the touch joystick region B1 increases. Certainly, the user may make definition on its own the first segment control regions B21 to control the moving speed of the movable element.

It may be learned from the embodiment in FIG. 5 that the instruction generation region B2 in the image of the visual joystick B includes four first segment control regions B21, and the first segment control regions B21 may include different quantities of second segment control regions B22. In this embodiment, the first segment control regions B21 may include different quantities of second segment control regions B22 according to different areas. Specifically, the first segment control region B21 closest to the touch joystick region B1 includes four second segment control regions B22, and the remaining first segment control regions B21 may include eight second segment control regions B22 because areas thereof gradually increase. It should be noted that quantities of the first segment control regions B21 and the second segment control regions B22 are only used as examples for description. The present invention is not limited thereto. By setting different quantities of the first segment control regions B21 or the second segment control regions B22, the accuracy of the touch instruction is improved.

According to the above, when the user touches and presses the touch joystick region B1 in the image of the visual joystick B and drags the touch joystick region B1 to be displaced toward different first segment control regions B21 and different second segment control regions B22, the user can correspondingly control the movable element to be displaced toward different directions at different moving speeds. When touching and pressing and controlling the image of the visual joystick B, the user may quickly determine, from images of the first segment control region B21 and the second segment control region B22 displayed on the operation interface W11 and through visual sense, a control speed or direction corresponding to a current operation, to more quickly and accurately perform control.

Referring to FIG. 5, in an embodiment in which the operation interface W11 includes the image of the visual joystick B, because the entire image of the visual joystick B is a two-dimensional circular planar image, the image of the visual joystick B is mainly used to control the movable element to move in two-dimensional directions that are perpendicular to one another. When the movable element needs to move in three-dimensional directions, the operation interface W11 may include both the image of the visual scroll wheel A and the image of the visual joystick B. A touch instruction corresponding to movement in two-dimensional directions is generated by using the image of the visual joystick B, and a touch instruction of moving in a third direction perpendicular to the two-dimensional directions is generated by using the image of the visual scroll wheel A, to satisfy a movement control need in three-dimensional directions.

Figure 6:
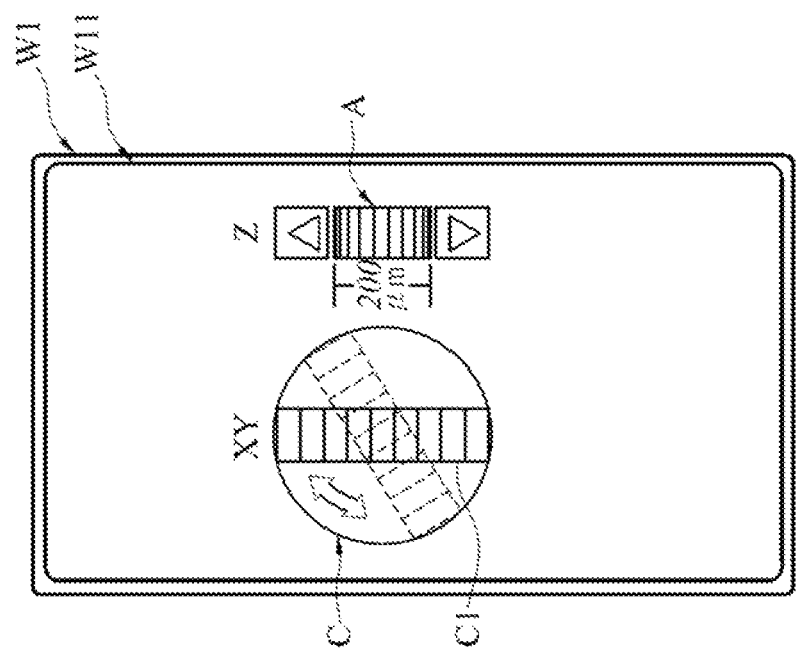
FIG. 6 is a schematic diagram of still yet another embodiment of an operation interface to which a control method of a touch display apparatus is applicable according to the present invention.

In an embodiment, referring to FIG. 6, the operation interface W11 may include an image of a visual rotating wheel C. Herein, the visual rotating wheel C has a circular outline and a rotating key C1 located within the range of the circular outline. The rotating key C1 is generally a long pattern horizontally crossing the central point of the image of the visual rotating wheel C. Therefore, the shape of the pattern of the visual rotating wheel C provides the user with a control manner capable of stimulating a physical button to touch and press the rotating key C1 for rotation. In this embodiment, a direction of a connecting line of two ends of the rotating key C1 is set as a direction controlling displacement of the movable element, and the rotating key C1 may generate a touch instruction when being dragged, rotated, or slid. A specific using method of the visual rotating wheel C is that the user may point the direction of the connecting line of the two ends of the rotating key C1 to a direction toward which the movable element is to be controlled to be displaced, and then performs sliding on the rotating key C1 to control the movable element to be displaced. Herein, a manner of performing sliding on the rotating key C1 to generate a touch instruction is the same as an operation manner of generating a touch instruction on the image of the visual scroll wheel A.

According to the above embodiment, the user may freely rotate the rotating key C1 to define a direction controlling displacement of the movable element, thereby enhancing the control freedom. In addition, in an embodiment, detecting a rotation action of the rotating key C1 to control rotation of the movable element is also a feasible implementation.

In the foregoing embodiments, the operation interface W11 may further include a value display region at a position adjacent to the visual scroll wheel A, the visual joystick B, or the visual rotating wheel C, and the value display region displays a largest displacement value of displacement that the movable element is controlled to correspondingly perform. The largest displacement value of displacement may be defined by the user, it can be ensured that the movable element is within an allowed or expected displacement range in a process in which the movable element is controlled to be displaced.

In the foregoing embodiments, the touch instructions generated by the user on the visual scroll wheel A, the visual joystick B, and the visual rotating wheel C may all be controlling the displacement directions of the movable element according to generation directions of the touch instructions. In other embodiments, distances and speeds of the touch instructions generated on the images of the visual scroll wheel A, the visual joystick B, and the visual rotating wheel C may be displacement, a distance, and a speed that correspondingly control the movable element. To be specific, the speed and the distance of the touch instruction generated on the operation interface W11 is in direct proportion to a speed and distance of displacement that the movable element is controlled to perform.

Certainly, because allowed displacement amounts of the movable element in different directions may be different, to be specific, the largest displacement amounts of the movable element in different directions are different, in addition to that the largest displacement values of the movable element in different directions may be separately set, a transmission ratio of the image of the visual scroll wheel A, the visual joystick B, or the visual rotating wheel C may be defined according to needs. For example, when four visual scroll wheels A are provided on the operation interface W11 to respectively correspond to control of an X direction, a Y direction, a Z direction of the movable element, and a momentum 8, when the largest displacement amount of the movable element in the X direction is far larger than that in the Z direction, the user can make definition on its own, under the touch instructions of generating the same distance on the images of the visual scroll wheels A corresponding to the X direction and the Z direction, correspondingly controlling the movable element to be displaced for different distances. For example, it is set that a sliding touch instruction of generating 1 cm on the image of the visual scroll wheel A corresponding to the X direction correspondingly controls the movable element to be displaced for 10 cm, and a sliding touch instruction of generating 1 cm on the image of the visual scroll wheel A corresponding to the Y direction correspondingly controls the movable element to be displaced for 1 cm. Therefore, it is ensured that control in the directions can be completed in limited space of the operation interface W11.

In addition, in the foregoing embodiments, a manner of generating the touch instruction on the images of the visual scroll wheel A, the visual joystick B, and the visual rotating wheel C to correspondingly control the movable element to be displaced may be, but is not limited to, controlling the movable element to be continuously and uninterruptedly displaced. In other embodiments, the movable element may be controlled to be displaced in a stepping manner, and corresponding indication information may be displayed on the operation interface W11 for the operator to learn of a current movable element displacement mode (for example, display of STEP indicates step displacement).

Referring to FIG. 2, in an embodiment, to make the user quickly determine a current position and a control status of the movable element on the touch display apparatus 14, the touch display apparatus 14 may further display a third window W3. The third window W3 may, but not limited to, overlap the second window W2 or the first window W1, and a current position data value of the movable element is displayed on the third window W3.

Referring to FIG. 2 again, further, in an embodiment, the touch display apparatus 14 further includes a fourth window W4. The fourth window W4 may, but not limited to, overlap the second window W2, and the fourth window W4 displays a digital wafer map. The wafer map displayed on the fourth window W4 is a digital wafer map of the wafer 20 displayed on the second window W2, and the wafer map of the fourth window W4 has a standard mark H. The touch instruction of controlling the movable element to be displaced on the operation interface W11 is controlling the displacement by using the standard mark H as a standard position. Position data displayed on the third window W3 is also a relative coordinate position value generated by using the standard mark H as a standard position.

It can be learned from the above that in the present invention, by displaying different visualized touch images for touch and control on the operation interface W11, the user controls the movable element in a touch manner, and visualized images or values on the operation interface W11 quickly provide the user with accurate control values, thereby improving the accuracy and efficiency of control of the movable element.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A control method of a touch display apparatus, applicable to a probe station, and the method comprises:
    displaying a first window and a second window on a touch display apparatus;
    displaying an operation interface on the first window, and displaying a real-time image on the second window, wherein the operation interface comprises an image of a visual scroll wheel, the image of the visual scroll wheel has a rectangular outline, a touch instruction can be generated through sliding along a long side of the image of the visual scroll wheel, wherein the real-time image on the second window is an image that is captured by a camera stage in real time and that is of a wafer on a chuck stage; and
    detecting the touch instruction generated on the operation interface, a movable element performs linear displacement according to the touch instruction, the real-time image varies according to a displacement of the movable element, wherein the movable element is selected from one of the chuck stage and the camera stage and the camera stage.

2. The control method of a touch display apparatus according to claim 1, wherein the first window can overlap the second window in a manner of displacement.

3. The control method of a touch display apparatus according to claim 1, wherein the first window further displays a value display region, and the value display region displays a largest displacement value of displacement that the visual scroll wheel controls the movable element to correspondingly perform.

4. The control method of a touch display apparatus according to claim 1, wherein the operation interface comprises an image of a visual joystick.

5. The control method of a touch display apparatus according to claim 4, wherein the image of the visual joystick further comprising a touch joystick region, an instruction generation region, and an instruction boundary, wherein the instruction boundary and the outline of the touch joystick region form a concentric circle, the range between the outline of the touch joystick region and the instruction boundary is the instruction generation region, and the touch instruction can be generated when contact with the touch joystick region is kept and the touch joystick region is dragged to the instruction generation region.

6. The control method of a touch display apparatus according to claim 4, wherein the instruction generation region further comprises a plurality of first segment control regions, the plurality of first segment control regions further separately comprises a plurality of second segment control regions, and the plurality of first segment control regions and the plurality of second segment control regions can respectively generate different touch instructions.

7. The control method of a touch display apparatus according to claim 6, wherein the touch instructions respectively generated in the plurality of first segment control regions can control the movable element to move at different moving speeds, and the touch instructions respectively generated in the plurality of second segment control regions can control the movable element to be displaced toward different displacement directions.

8. The control method of a touch display apparatus according to claim 1, wherein the operation interface comprises an image of a visual rotating wheel, the visual rotating wheel has a circular outline and a rotating key located within the range of the circular outline, and touch and press and rotation are performed on the rotating key to change a displacement direction of the movable element.

9. The control method of a touch display apparatus according to claim 1, wherein the operation interface comprises the image of the visual scroll wheel and an image of a visual joystick.

10. The control method of a touch display apparatus according to claim 1, wherein a manner of generating the touch instruction on the operation interface is tap, sliding, or multi-touch.

11. The control method of a touch display apparatus according to claim 1, wherein the touch display apparatus further displays a third window, and the third window displays movement information of the movable element.

12. The control method of a touch display apparatus according to claim 1, wherein the probe station further includes a casing, the movable element is disposed inside of the casing, the touch display apparatus is disposed outside of the casing.

13. The control method of a touch display apparatus according to claim 1, wherein the touch display apparatus is disposed outside of a casing of the probe station, and the chuck stage, the camera stage and the positioner are disposed inside of the casing.

* * * * *

UNITED STATES PATENT AND TRADEMARK OFFICE
CERTIFICATE OF CORRECTION

| | | |
|---|---|---|
| PATENT NO. | : 11,144,198 B2 | Page 1 of 1 |
| APPLICATION NO. | : 16/364747 | |
| DATED | : October 12, 2021 | |
| INVENTOR(S) | : Chen et al. | |

It is certified that error appears in the above-identified patent and that said Letters Patent is hereby corrected as shown below:

On the Title Page

In Item (72) please add inventors:
--Christoph Klaus Dresden, Germany,
Ingo Berg Dresden, Germany,
Frank Fehrmann Dresden, Germany--

Please delete inventor:
"Guan-Jhih Liou"

Signed and Sealed this
Second Day of September, 2025

Coke Morgan Stewart
*Acting Director of the United States Patent and Trademark Office*